(12) United States Patent
Baumann et al.

(10) Patent No.: US 11,397,223 B2
(45) Date of Patent: Jul. 26, 2022

(54) HALL SENSOR AND METHOD FOR OPERATION OF SUCH A SENSOR

(71) Applicant: TDK-Micronas GmbH, Freiburg im Breisgau (DE)

(72) Inventors: Marc Baumann, Freiburg (DE); David Muthers, Denzlingen (DE); Thomas Desel, Freiburg (DE)

(73) Assignee: TDK-Micronas GmbH, Freiburg im Breisgau (DE)

( * ) Notice: Subject to any disclaimer, the term of this patent is extended or adjusted under 35 U.S.C. 154(b) by 418 days.

(21) Appl. No.: 16/511,181

(22) Filed: Jul. 15, 2019

(65) Prior Publication Data

US 2020/0025842 A1 Jan. 23, 2020

(30) Foreign Application Priority Data

Jul. 19, 2018 (DE) ...................... 10 2018 005 676.8

(51) Int. Cl.
| | |
|---|---|
| *G01R 33/07* | (2006.01) |
| *G01R 33/00* | (2006.01) |
| *G01D 5/244* | (2006.01) |
| *G01D 5/245* | (2006.01) |
| *G01D 5/14* | (2006.01) |

(52) U.S. Cl.
CPC ........... *G01R 33/072* (2013.01); *G01D 5/145* (2013.01); *G01D 5/2454* (2013.01); *G01D 5/24466* (2013.01); *G01R 33/0035* (2013.01)

(58) Field of Classification Search
CPC ........ G01R 1/00; H01L 21/00; H01L 2221/00
See application file for complete search history.

(56) References Cited

U.S. PATENT DOCUMENTS

| | | | | |
|---|---|---|---|---|
| 2015/0168508 A1* | 6/2015 | Ausserlechner | ...... | H01L 43/065 324/251 |
| 2016/0252599 A1* | 9/2016 | Motz | .................... | G01R 33/075 324/251 |
| 2016/0259017 A1* | 9/2016 | Iriguchi | ............. | G01R 33/0094 |
| 2017/0184688 A1* | 6/2017 | Nakamura | ............. | G01R 33/07 |
| 2017/0234910 A1* | 8/2017 | Nakamura | ......... | G01R 33/0029 324/251 |
| 2018/0259598 A1* | 9/2018 | Iriguchi | ................ | H01L 43/065 |

FOREIGN PATENT DOCUMENTS

DE 102006057385 A1 6/2008

* cited by examiner

*Primary Examiner* — Jermele M Hollington
*Assistant Examiner* — Temilade S Rhodes-Vivour
(74) *Attorney, Agent, or Firm* — The Webb Law Firm (57) ABSTRACT

A Hall sensor has a Hall sensor element, which has multiple connection points spaced apart from one another. A supply source serves for feeding an exciter current into the Hall sensor element and is connected to a first and a second connection point of the Hall sensor element. The Hall sensor has a first and a second comparison device. The first comparison device has a first input connected to a third connection point of the Hall sensor element, a second input connected to a reference signal generator for an upper reference value signal, and an output for a first comparison signal. The second comparison device has a third input connected to the third connection point, a fourth input connected to a reference signal generator for a lower reference value signal, and an output for a second comparison signal. The outputs are connected to an evaluation device for generating an error signal as a function of the first and second comparison signal.

8 Claims, 5 Drawing Sheets

| Phase | C1 | C2 | C3 | C4 |
|---|---|---|---|---|
| 1 | $V_B$ | GND | $V_B/2$ | $V_B/2$ |
| 2 | $V_B/2$ | $V_B/2$ | GND | $V_B$ |
| 3 | GND | $V_B$ | $V_B/2$ | $V_B/2$ |
| 4 | $V_B/2$ | $V_B/2$ | $V_B$ | GND |

Fig. 3

| Phase | C1 | | C2 | | C3 | | C4 | |
|---|---|---|---|---|---|---|---|---|
| | T1 | T2 | T1 | T2 | T1 | T2 | T1 | T2 |
| 1 | C1>T1 | C1>T2 | C2<T1 | C2<T2 | C3>T1 | C3<T2 | C4>T1 | C4<T2 |
| 2 | C1>T1 | C1<T2 | C2>T1 | C2<T2 | C3<T1 | C3<T2 | C4>T1 | C4>T2 |
| 3 | C1<T1 | C1<T2 | C2>T1 | C2>T2 | C3>T1 | C3<T2 | C4>T1 | C4<T2 |
| 4 | C1>T1 | C1<T2 | C2>T1 | C2<T2 | C3>T1 | C3>T2 | C4<T1 | C4<T2 |

Fig. 6

| Phase | C1 | | C2 | | C3 | | C4 | |
|---|---|---|---|---|---|---|---|---|
| | T1 | T2 | T1 | T2 | T1 | T2 | T1 | T2 |
| 1 | 1 | 1 | 0 | 0 | 1 | 0 | 1 | 0 |
| 2 | 1 | 0 | 1 | 0 | 0 | 0 | 1 | 1 |
| 3 | 0 | 0 | 1 | 1 | 1 | 0 | 1 | 0 |
| 4 | 1 | 0 | 1 | 0 | 1 | 1 | 0 | 0 |

HALL SENSOR AND METHOD FOR OPERATION OF SUCH A SENSOR

CROSS-REFERENCE TO RELATED APPLICATION

This application claims priority to German Patent Application No. 10 2018 005 676.8 filed Jul. 19, 2018, the disclosure of which is hereby incorporated by reference in its entirety.

BACKGROUND OF THE INVENTION

Field of the Invention

The invention relates to a method for operation of a Hall sensor, which has the following steps:

a.) providing a Hall sensor, which has a Hall sensor element having multiple connection points spaced apart from one another, and providing a current supply source or voltage supply source, which has supply connectors for output of a supply current or a supply voltage, b.) connecting a first connection point of the Hall sensor element to a first supply connector and connecting a second connection point of the Hall sensor element to a second supply connector, so as to apply the supply voltage to the Hall sensor element or to conduct the supply current through the Hall sensor element.

Furthermore, the invention relates to a Hall sensor having a Hall sensor element that has multiple connection points spaced apart from one another with a current supply source or voltage supply source that has a first and a second supply connector for output of a supply current or a supply voltage, wherein the first supply connector is connected or can be connected to a first connection location of the Hall sensor element, and the second supply connector is connected or can be connected to a second connection point of the Hall sensor element, so as to feed a current into the Hall sensor element.

Description of Related Art

Such a Hall sensor and such a method are known from DE 102 04 427 B4. The Hall sensor has an approximately plate-shaped Hall sensor element, which has multiple connection points on its edge, spaced apart from one another in the circumferential direction. The connection points are offset with reference to a center, at uniform angle distances, in such a manner that two connection points, in each instance, lie diametrically opposite one another. If an exciter current is fed into the Hall sensor element by means of connecting two connection points that lie diametrically opposite one another to the supply connectors of a current supply source or a voltage supply source, and if a magnetic flux density passes through the Hall sensor element transverse to its plate plane, the Lorentz force acts on the moving electrons of the current, deflecting the electrons transverse to their movement direction in the plate plane. As a result, an electric field builds up in the Hall sensor element transverse to the current direction, which field can be tapped as an electric voltage between the connection points that are not connected to the supply connectors. This voltage is referred to as a Hall voltage.

However, in practical use of Hall sensors, the Hall voltage has an undesirable offset voltage superimposed on it. Hall sensor elements are generally produced together with the supply source and electronics for signal processing as integrated circuits, and mounted in a chip carrier and in a housing made of plastic. Due to production tolerances and during assembly, mechanical stresses can occur in the semiconductor crystal, which stresses can cause the offset voltage.

For compensation of the offset voltages, what is called the spinning Hall principle is used in the method known from DE 102 04 427 B4. In this regard, the exciter current is passed through the Hall sensor element in different directions, and the mean value of the measured voltages is formed.

Although the Hall sensor known from DE 102 04 427 B4 and the method known from it have proven themselves in a great number of applications in practice, they nevertheless could be improved. Hence demands regarding reliability of the Hall sensors have increased due to the constantly increasing number of Hall sensors installed in motor vehicles, for example. This is because failure of only a single Hall sensor can lead to malfunction of the motor vehicle if the error is not detected and compensated by means of corresponding measures, if necessary.

The problem is therefore that of creating a Hall sensor of the type stated initially and a method for operation of a Hall sensor of the type stated initially, which make it possible, in simple manner, to detect and report possible errors that might occur during operation of the Hall sensor.

SUMMARY OF THE INVENTION

This problem is solved with a Hall sensor and method according to the invention. The method provides for the following further steps, in addition to Steps a) and b) mentioned initially:

a.) providing a lower reference value and an upper reference value for a voltage applied at a third connection point of the Hall sensor element, b.) detecting a first voltage value for this voltage, c.) comparing the first voltage value with the lower reference value and the upper reference value, d.) generating an error signal as a function of the results of these comparisons.

In advantageous manner, an error signal is therefore generated if the voltage at the third connection point lies outside of a predetermined range and is therefore not plausible. In particular, an error is detected if the first voltage value is not greater than the lower reference value and/or if the first voltage value is not less than the upper reference value. It is assumed that the voltage at the third connection point is essentially influenced by the voltage applied by the supply source, between the first and second connection point, or by the exciter current passed through the Hall sensor element by way of this connection point, and that the influence of the Hall voltage on the first voltage value is low in comparison. In particular, the voltage component contained in the first voltage value, which is brought about by means of inducing a Hall voltage in the Hall sensor element, is less than one-fourth, possibly less than one-sixth and preferably less than one-tenth of the first voltage value. In other words, a voltage is measured at the third connection point, which voltage is brought about, in the case of a flow of current through the Hall sensor, by means of a voltage drop at a partial resistance of the ohmic resistor of the Hall sensor element.

The distance between the lower and upper reference value is selected to be greater than the greatest Hall voltage that can normally be expected. The distance between the lower and upper reference value or the width of the tolerance band can amount to at least 5%, possibly at least 10%, preferably at least 20% and, in particular, at least 30% of the voltage applied between the first and the second supply connector of the current supply source or voltage supply source. The first voltage value is measured against the potential of one of the supply connectors or against a reference potential that is fixed with regard to the potentials of the supply connectors and differs from the potentials of the supply connectors.

The error signal is generated, in particular, if the electrical connection between the third connection point and a measurement device that serves to detect the first voltage value is disrupted, for example has an interruption and/or a short-circuit to a line carrying a different potential and/or if the exciter current is not passed through the Hall sensor element or is conducted through it at an incorrect amperage.

In a preferred embodiment of the invention, the following further steps are carried out:

a.) detecting a second voltage value for a voltage applied at a fourth connection point of the Hall sensor element, b.) comparing the second voltage value to the lower reference value and the upper reference value, c.) generating the error signal as a function of the results of these comparisons.

By means of this additional measure, it can be determined, in particular, when the electrical connection between the fourth connection point and a measurement device that serves for detecting the second voltage is disrupted, for example because the connection has an interruption and/or a short-circuit to a line that carries a different potential. The second voltage value is measured against the potential of one of the supply connectors or against the reference potential, which is fixed with regard to the potentials of the supply connectors and differs from the potentials of the supply connectors. Preferably, the voltage component contained in the second voltage value, which is brought about by inducing a Hall voltage, is less than one-fourth, possibly less than one-sixth and preferably less than one-tenth of the first voltage value. In other words, a voltage is measured at the fourth connection point, which voltage is brought about, in the case of a flow of current through the Hall sensor, by means of a voltage drop at a partial resistance of the ohmic resistor of the Hall sensor element. In particular, an error is detected if the second voltage value is not greater than the lower reference value and/or if the second voltage value is not less than the upper reference value.

In an advantageous embodiment of the invention, the following further steps are carried out:

a.) detecting a third voltage value for a voltage applied at the first connection point of the Hall sensor element, b.) comparing the third voltage value with the lower reference value and the upper reference value, c.) generating the error signal as a function of the results of these comparisons.

The error signal is therefore activated even if the potential applied by the supply source to the first connection point has an impermissible value. The third voltage value is measured against the potential of one of the supply connectors or against the reference potential, which is fixed with regard to the potentials of the supply connectors and differs from the potentials of the supply connectors.

In a practical embodiment of the invention, the following further steps are carried out:

a.) detecting a fourth voltage value for a voltage applied at the second connection point of the Hall sensor element, b.) comparing the fourth voltage value with the lower reference value and the upper reference value, c.) generating the error signal as a function of the results of these comparisons.

The error signal is therefore activated even if the potential applied by the supply source to the second connection point has an impermissible value. The fourth voltage value is measured against the potential of one of the supply connectors or against the reference potential, which is fixed with regard to the potentials of the supply connectors and differs from the potentials of the supply connectors.

In a preferred embodiment of the method, the method steps as applicable are run through multiple times, wherein in the case of the second and, if applicable, every further pass, the connection points of the Hall sensor element are cyclically exchanged, in each instance. The number of passes is therefore preferably at least as great as the number of connection points of the Hall sensor. In this regard, it is even possible to detect the first, second, third and/or fourth voltage value in offset-compensated manner, in other words possibly to calculate the offset voltages contained in them. However, it is also conceivable to ignore offset compensation in the detection of these voltage values.

In the case of the method according to the invention, the voltage between the third and the fourth connection point of the Hall sensor element can be measured, in a manner known per se, so as to determine the Hall voltage. For measuring the Hall voltage, the spinning Hall principle is preferably used, so as to compensate offset voltages possibly contained in the measured signal.

The problem stated above is also solved with regard to the Hall sensor of the type stated initially in that the Hall sensor has a first comparison device, which has a first input connected to the third connection point, a second input connected to a reference signal generator for an upper reference value signal, and an output for a first comparison signal, that the Hall sensor has a second comparison device, which has a third input connected to the third connection point, a fourth input connected to a reference signal generator for a lower reference value signal, and an output for a second comparison signal, and that the outputs of the first and second comparison device are connected to an evaluation device for generating an error signal that is a function of the first and second comparison signal. Preferably, the potential of the upper reference value signal is fixed with regard to the potentials of the supply connectors and differs from the potentials of the supply connectors. Also, the potential of the lower reference value signal can be fixed with regard to the potentials of the supply connectors and differ from the potentials of the supply connectors. In particular, an error is detected if the potential at the first input of the first comparison device is not less than at the second input of the first comparison device and/or if the potential at the third input of the second comparison device is not greater than at the fourth input of the second comparison device. The distance between the potentials of the lower and upper reference value signal or the width of the tolerance range can amount to at least 5%, possibly at least 10%, preferably at least 20%, and, in particular, at least 30% of the voltage applied between the first and the second supply connector of the current supply source or voltage supply source.

The Hall sensor thus makes it possible to generate an error signal if the voltage at the third connection point lies outside of a range predetermined by the reference value signal and is therefore not plausible. In this regard, it is assumed that the voltage at the third connection point is essentially influenced by the voltage applied by the supply source between the first and second connection point or by the exciter current passed through the Hall sensor element by way of this connection point, and that the influence of the Hall voltage on the first voltage value can be ignored. The error signal can be generated, in particular, if the electrical connection between the third connection point and a measurement device that serves to detect the first voltage value is disrupted, for example has an interruption and/or a short-circuit to a line that carries a different potential and/or if the exciter current is not passed through the Hall sensor element due to an error or is passed through at an incorrect amperage.

In a preferred embodiment of the invention, it is provided that the Hall sensor has a third comparison device, which has a fifth input connected to the fourth connection point, a sixth input connected to the reference signal generator for the upper reference value signal, and an output for a third comparison signal, that the Hall sensor has a fourth comparison device, which has a seventh input connected to the fourth connection point, an eighth input connected to the reference signal generator for the lower reference value signal, and an output for a fourth comparison signal, and that the outputs of the third and fourth comparison device are connected to the evaluation device, and the evaluation device is configured in such a manner that the error signal is also a function of the third and fourth comparison signal. In this way, the error signal can be generated even if the electrical connection between the fourth connection point and the fifth and/or seventh input is disrupted, for example has an interruption and/or a short-circuit to a line that carries a different potential. In particular, an error is detected if the potential at the fifth input of the third comparison device is not less than at the sixth input of the third comparison device and/or if the potential at the seventh input of the third comparison device is not greater than at the eighth input of the third comparison device.

In an advantageous embodiment of the invention, the Hall sensor has a fifth comparison device, which has a ninth input connected to the first connection point, a tenth input connected to the reference signal generator for the upper reference value signal, and an output for a fifth comparison signal, that the Hall sensor has a sixth comparison device, which has an eleventh input connected to the first connection point, a twelfth input connected to the reference signal generator for the lower reference value signal, and an output for a sixth comparison signal, and that the evaluation device is configured in such a manner that the error signal is also dependent on the fifth and sixth comparison signal. In this way, the error signal can be generated even if the potential applied to the first connection point by the supply source has an impermissible value, and therefore an exciter current with an incorrect value is passed through the Hall sensor element, or actually no exciter current at all is passed through the Hall sensor element. In particular, an error is detected if the potential at the ninth input of the fifth comparison device is not greater than at the tenth input of the third comparison device and/or if the potential at the eleventh input of the sixth comparison device is not less than at the twelfth input of the sixth comparison device.

In a practical embodiment of the invention, the Hall sensor has a seventh comparison device, which has a thirteenth input connected to the second connection point, a fourteenth input connected to the reference signal generator for the upper reference value signal, and an output for a seventh comparison signal, that the Hall sensor has an eighth comparison device, which has a fifteenth input connected to the second connection point, a sixteenth input connected to the reference signal generator for the lower reference value signal, and an output for an eighth comparison signal, and that the evaluation device is configured in such a manner that the error signal is also dependent on the seventh and eighth comparison signal. By means of this measure as well, errors in the current application to the Hall sensor element with the exciter current can be detected, for example if no exciter current is passed through the Hall sensor element due to a contacting error between a supply connector and the second connection point. In particular, an error is detected if the potential at the thirteenth input of the seventh comparison device is not less than at the fourteenth input of the seventh comparison device and/or if the potential at the fifteenth input of the eighth comparison device is not less than at the sixteenth input of the eighth comparison device.

In a further development of the invention, the Hall sensor has a switching device in control connection with a control device, which switching device is configured in such a manner a.) that in a first operating state
the first and third input are connected to the third connection point,
the fifth and seventh input are connected to the fourth connection point,
the ninth and eleventh input are connected to the first connection point,
the thirteenth and fifteenth input are connected to the second connection point,
b.) that in a second operating state
the first and third input are connected to the fourth connection point,
the fifth and seventh input are connected to the first connection point,
the ninth and eleventh input are connected to the second connection point,
the thirteenth and fifteenth input are connected to the third connection point,
c.) that in a third operating state
the first and third input are connected to the first connection point,
the fifth and seventh input are connected to the second connection point,
the ninth and eleventh input are connected to the third connection point,
the thirteenth and fifteenth input are connected to the fourth connection point, and
d.) that in a fourth operating state
the first and third input are connected to the second connection point,
the fifth and seventh input are connected to the third connection point,
the ninth and eleventh input are connected to the fourth connection point,
the thirteenth and fifteenth input are connected to the fifth connection point, and that the second, sixth, tenth, and fourteenth input are connected, in each instance, to the reference value generator for the upper reference value signal, and the fourth, eighth, twelfth, and sixteenth input are connected, in each instance, to the reference value generator for the lower reference value signal.

For measuring a Hall voltage that occurs when a magnetic flux density passes through the Hall sensor element, the Hall sensor can have a measuring device with which an electric voltage applied between the third and fourth connection point can be measured. The Hall sensor preferably functions according to the spinning Hall principle, so as to compensate possible undesirable offset voltages that are superimposed on the Hall voltage. It should still be mentioned that both in the case of the method according to the invention and in the case of the Hall sensor according to the invention, the Hall sensor element can be configured as a vertical Hall sensor element or as a horizontal Hall sensor element. A vertical Hall sensor element is understood to mean a Hall sensor element that is sensitive to magnetic flux densities that are disposed parallel to the chip surface of the semiconductor chip. A horizontal or lateral Hall sensor element is understood to be a Hall sensor element that is sensitive to magnetic flux densities that are disposed at a right angle to the chip surface of the semiconductor chip.

BRIEF DESCRIPTION OF THE DRAWINGS

In the following, exemplary embodiments of the invention are explained in greater detail using the drawing. This shows.

DESCRIPTION OF THE INVENTION

Figure 1:
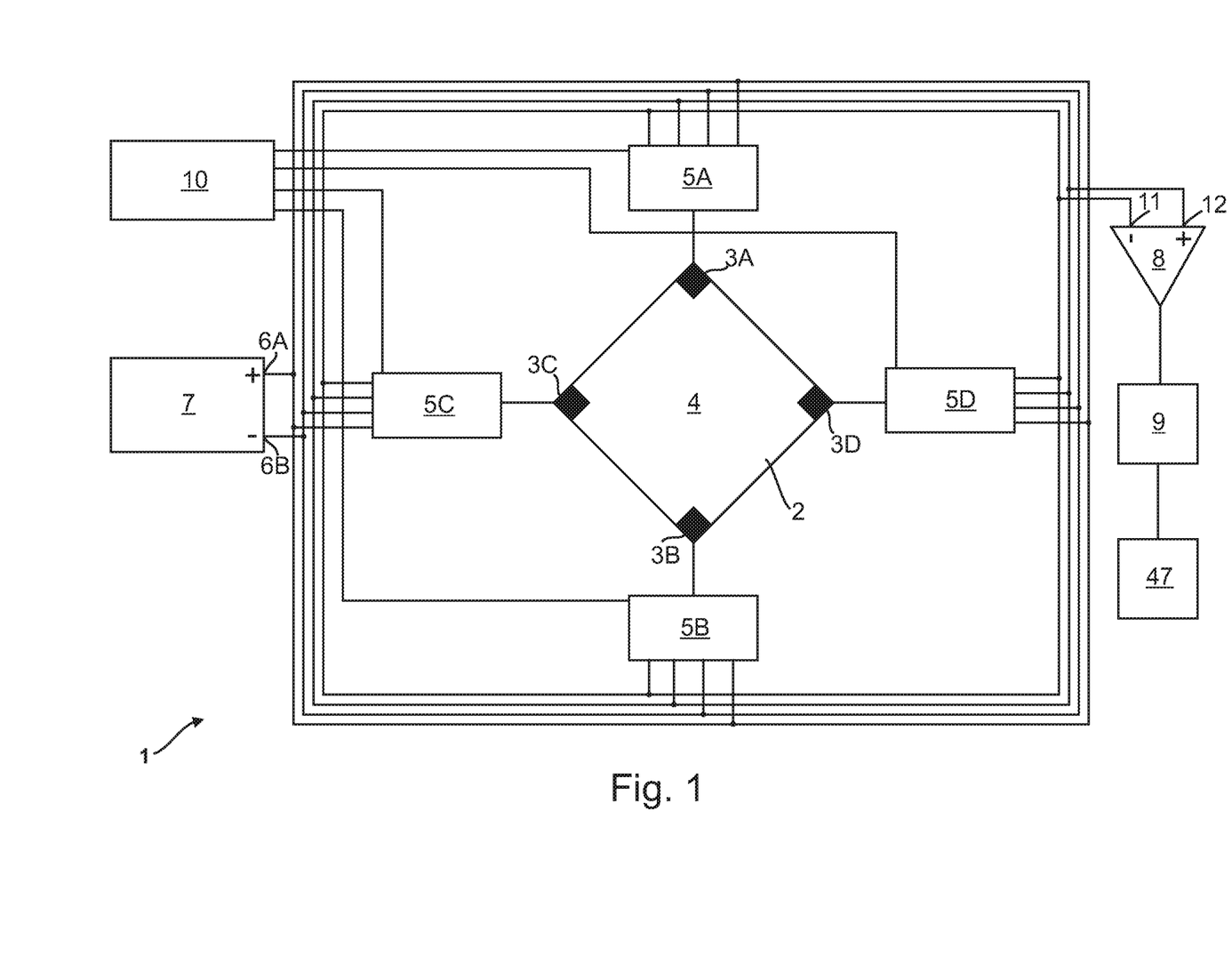
FIG. 1 a block schematic of a Hall sensor that functions according to the spinning Hall principle, FIG. 2 a graphic representation of the electrical voltages measured against ground potential at the connection points of a Hall sensor element of the Hall sensor, FIG. 3 a table in which electrical voltages are listed, which are applied at connection points C1, C2, C3, C4 of the Hall sensor element, FIG. 4 a representation similar to FIG. 2, in which tolerance bands and reference values T1, T2 are shown, FIG. 5 a block schematic of a Hall sensor that functions according to the spinning Hall principle, which has a monitoring device by means of which it can be checked whether the electrical voltages at connection points C1, C2, C3, C4 of the Hall sensor element lie within the tolerance bands provided for them, FIG. 6 a table in which the voltages that are present in the case of proper functioning of the Hall sensor, at the connection points C1, C2, C3, C4 of the Hall sensor element, are compared with the reference values T1, T2, and FIG. 7 a representation similar to FIG. 6, wherein, however, logical signal levels are indicated as table values, which are generated using comparison devices.

A Hall sensor indicated as a whole as 1 in FIG. 1 has a semiconductor chip into which a plate-shaped Hall sensor element 2 is integrated. The Hall sensor element 2 consists of a semiconductor material, such as silicon, for example, and has multiple connection points 3A, 3B, 3C, 3D on its edge, spaced apart from one another, which are offset from one another by 90° with reference to an imaginary center axis, which runs orthogonal to the plane spanned by the Hall sensor element 2, through a center of symmetry 4.

The connection points 3A, 3B, 3C, 3D are connected to a switching device, which has a multiplexer 5A, 5B, 5C, 5D, in each instance, for every connection point 3A, 3B, 3C, 3D. An output connector of each multiplexer 5A, 5B, 5C, 5D is connected, in each instance, to a connection point 3A, 3B, 3C, 3D assigned to it. Each multiplexer 5A, 5B, 5C, 5D has two inputs, in each instance, which are connected to supply connectors 6A, 6B of a current supply source or voltage supply source 7. This supply voltage $V_B$, provided by the supply source 7, serves to feed an exciter current into the Hall sensor element 2.

In a first phase of current application, a first supply connector 6A is connected to the first connection point 3A of the Hall sensor element 2 by way of a first multiplexer 5A, and the second supply connector 6B is connected to a second connection point 3B of the Hall sensor element 2 by way of a second multiplexer 5B.

In a second phase of current application, the second supply connector 6B is connected to a third connection point 3C of the Hall sensor element 2 by way of a third multiplexer 5C, and the first supply connector 6A is connected to a fourth connection point 3D of the Hall sensor element 2 by way of a fourth multiplexer 5D.

In a third phase of current application, the first supply connector 6A is connected to the second connection point 3B of the Hall sensor element 2 by way of the second multiplexer 5B, and the second supply connector 6B is connected to the first connection point 3A of the Hall sensor element 2 by way of the first multiplexer 5A. The exciter current therefore flows in the opposite direction in the third phase as in the first phase.

In a fourth phase of current application, the first supply connector 6A is connected to the third connection point 3C of the Hall sensor element 2 by way of a third multiplexer 5C, and the second supply connector 6B is connected to a fourth connection point 3D of the Hall sensor element 2 by way of the fourth multiplexer 5D. The exciter current therefore flows in the opposite direction in the fourth phase as in the second phase.

Two further inputs of each multiplexer 5A, 5B, 5C, 5D are electrically connected to input connectors 11, 12 of a measuring device 8, which is provided for measuring the voltages between two diametrically opposite connection points 3A, 3B or 3C, 3D. For digitalization of the voltages measured, the measuring device 8 has a digital/analog converter not shown in any detail in the drawing, which is connected to a data memory 9 to store measured values. The data memory 9 is connected to an evaluation device 47, in which the measured voltage values are processed, so as to compensate offset voltages contained in them, which are superimposed on the Hall voltages. The Hall sensor element 2 has a magnetic flux density flowing through it during measurement of the Hall voltage, transverse to its plane of expanse, which density is not shown in any detail in the drawing and can flow into the drawing plane of FIG. 1, for example.

The multiplexers 5A, 5B, 5C, 5D each have a control input, which is in control connection with a common control device 10. By sending a corresponding control signal to the control input, the multiplexer 5A, 5B, 5C, 5D concerned can be configured in such a manner, in each instance, that the connection point 3A, 3B, 3C, 3D connected to the output connector of the multiplexer 5A, 5B, 5C, 5D is optionally or alternately electrically connected to one of the inputs of the multiplexer 5A, 5B, 5C, 5D or separated from it.

Figure 2:
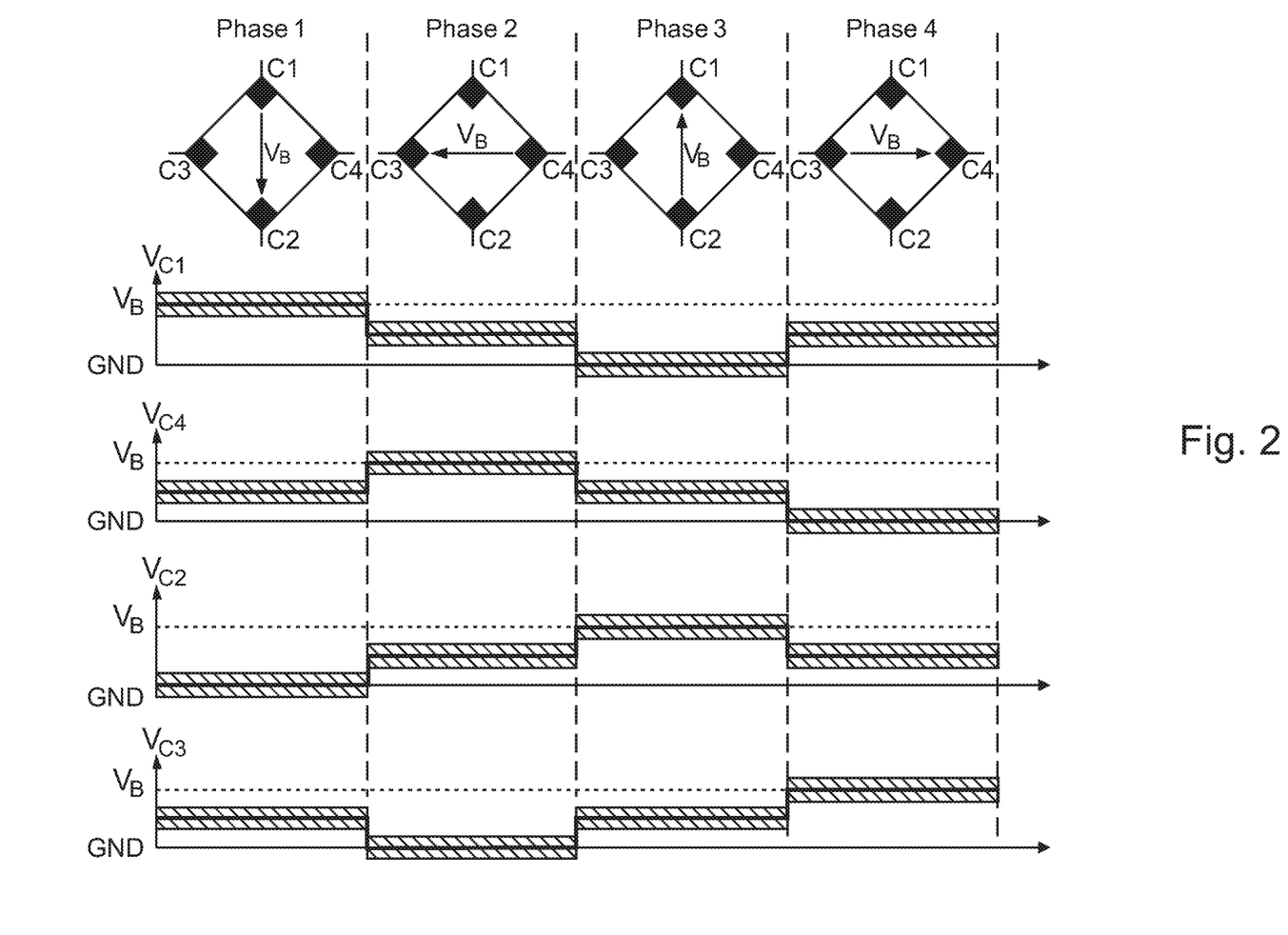
Figure 3:
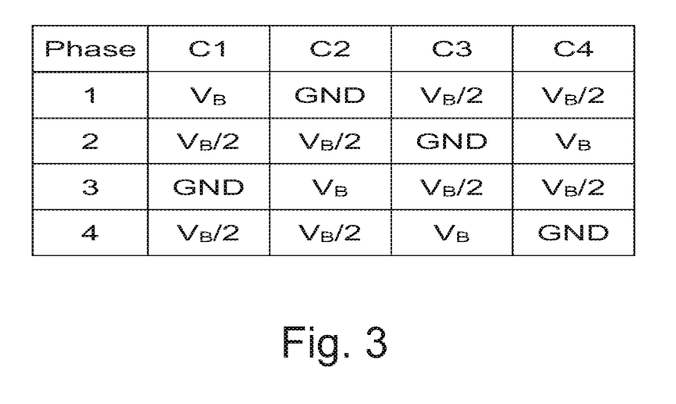

In FIG. 2, the voltages applied against ground potential during operation of the Hall sensor 1, at the individual connection points 3A, 3B, 3C, 3D, are shown graphically. In the first phase, in the case of an error-free Hall sensor 1, the supply voltage $V_B$ is applied to the first connection point 3A (voltage $V_{C1}$) of the Hall sensor element 2, and ground potential is applied to the second connection point 3B (voltage $V_{C2}$). Since the Hall sensor element 2 behaves approximately like a Wheatstone bridge, half of the supply voltage $V_B$ is applied at the third and fourth connection point (voltages $V_{C3}$ and $V_{C4}$) against ground if no Hall voltage and no offset voltages are present (FIG. 3). In practical operation, the voltages at the four connection points 3A, 3B, 3C, 3D can vary slightly from these values, due to the Hall voltage and the offset voltages. This is shown schematically in FIG. 2, by means of tolerance bands.

Figure 4:
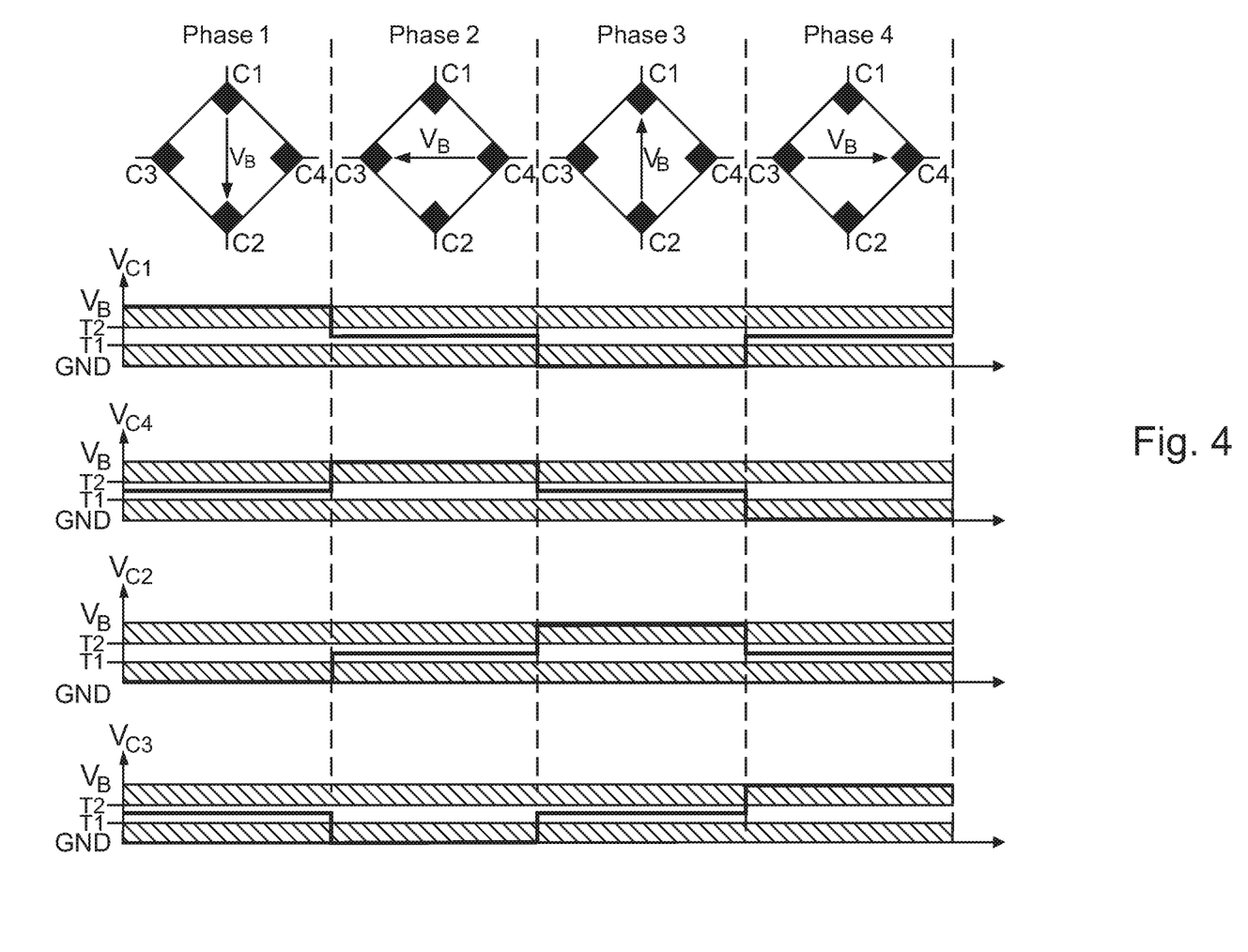

As can be seen in FIG. 4, there are three tolerance bands that occur, of which a lower tolerance band extends from ground potential up to a lower reference value T1. A center tolerance band extends from the lower reference value T1 to an upper reference value T2, and an upper tolerance band extends from the upper reference value T2 up to the supply voltage $V_B$. The upper reference value T2 has the value $(\frac{2}{3}) \cdot V_B$, and the lower reference value T1 has the value $(\frac{1}{3}) \cdot V_B$, wherein $V_B$ is the supply voltage provided by the supply source 7, which is applied between the first and second connection points 3A, 3B.

Figure 5:
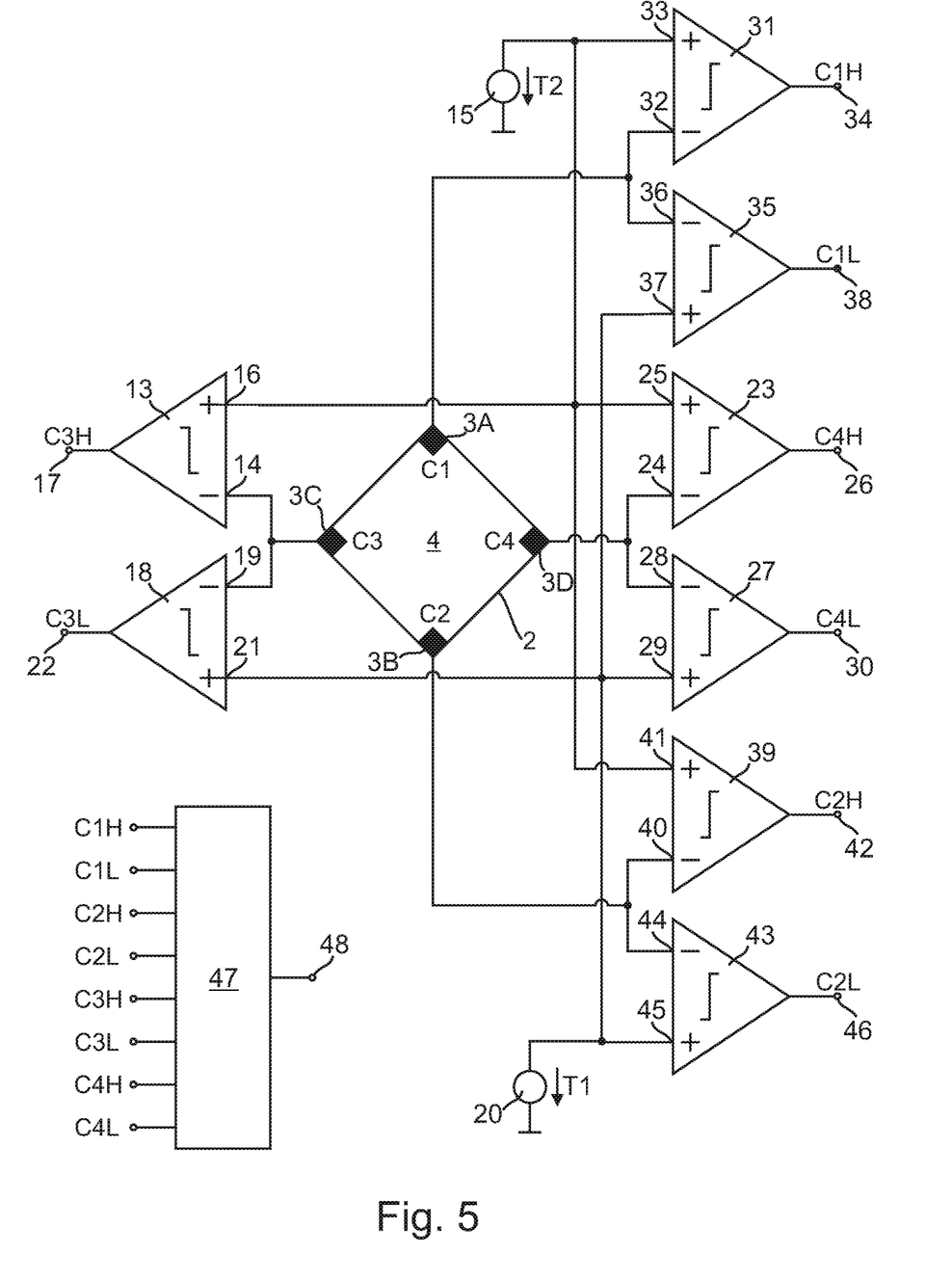
Figure 6:
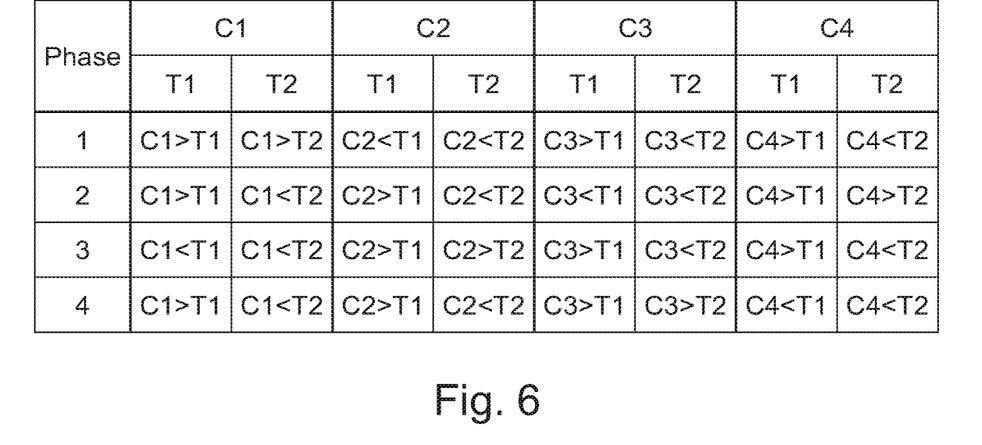
Figure 7:
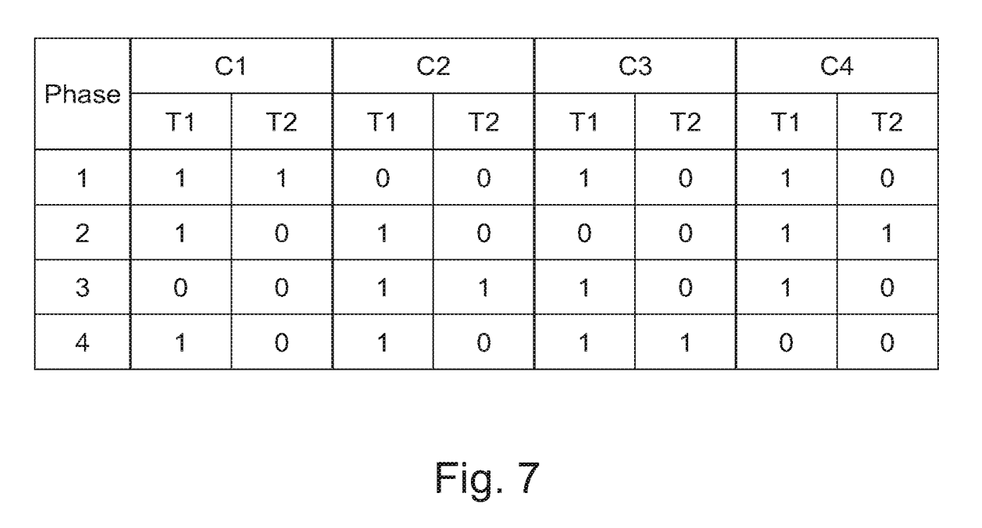

To check whether the voltages lie within the tolerance bands provided for this purpose, the Hall sensor 1 has a monitoring device. As can be seen in FIG. 5, the monitoring device has a first comparison device 13, which has a first input 14 connected to the third connection point 3C, a second input 16 connected to a first connector of a reference signal generator 15 for an upper reference value signal, and an output 17 for a first comparison signal. A second connector of the reference signal generator 15 lies at ground potential. As can be seen in FIG. 6, in the case of an error-free Hall sensor 1 the voltage at the third connection point 3C in phase 1 must be less than the upper reference value T2. This is checked using the first comparison device 13. If the comparison result does not agree with this, in other words yields the logical value "1" (FIG. 7), an error signal is generated.

Furthermore, the Hall sensor 1 has a second comparison device 18, which has a third input 19 connected to the third connection point, a fourth input 21 connected to a first connector of a reference signal generator 20 for a lower reference value signal, and an output 22 for a second comparison signal. A second connector of the reference signal generator 20 lies at ground potential. As can be seen in FIG. 6, in the case of an error-free Hall sensor 1 the voltage at the third connection point 3C in phase 1 must be greater than the lower reference value T1. This is checked using the second comparison device 18. If the comparison result does not agree with this, in other words yields the logical value "0" (FIG. 7), the error signal is generated.

A third comparison device 23 has a fifth input 24 connected to the fourth connection point 3D, a sixth input 25 connected to the reference signal generator 15 for the upper reference value signal, and an output 26 for a third comparison signal. As can be seen in FIG. 6, in the case of an error-free Hall sensor 1 the voltage at the fourth connection point 3D in phase 1 must be less than the upper reference value T2. This is checked using the third comparison device 23. If the comparison result does not agree with this, in other words yields the logical value "1" (FIG. 7), the error signal is generated.

A fourth comparison device 27 of the Hall sensor 1 has a seventh input 28 connected to the fourth connection point 3D, an eighth input 29 connected to the reference signal generator 20 for the lower reference value signal, and an output 30 for a fourth comparison signal. As can be seen in FIG. 6, in the case of an error-free Hall sensor 1 the voltage at the fourth connection point 3D in phase 1 must be greater than the lower reference value T1. This is checked using the fourth comparison device 27. If the comparison result does not agree with this, in other words yields the logical value "0" (FIG. 7), the error signal is set.

As can furthermore be seen in FIG. 5, the Hall sensor 1 also has a fifth comparison device 31, which has a ninth input 32 connected to the first connection point 3A, a tenth input 33 connected to the reference signal generator 15 for the upper reference value signal, and an output 34 for a fifth comparison signal. As can be seen in FIG. 6, in the case of an error-free Hall sensor 1 the voltage at the first connection point 3A in phase 1 must be greater than the upper reference value T2. This is checked using the fifth comparison device 31. If the comparison result does not agree with this, in other words yields the logical value "0" (FIG. 7), the error signal is generated.

A sixth comparison device 35 has an eleventh input 36 connected to the first connection point 3A, a twelfth input 37 connected to the reference signal generator 20 for the lower reference value signal, and an output 38 for a sixth comparison signal. As can be seen in FIG. 6, in the case of an error-free Hall sensor 1 the voltage at the first connection point 3A in phase 1 must be greater than the lower reference value T1. This is checked using the sixth comparison device 35. If the comparison result does not agree with this, in other words yields the logical value "0" (FIG. 7), the error signal is generated.

A seventh comparison device 39 of the Hall sensor 1 has a thirteenth input 40 connected to the second connection point 3B, a fourteenth input 41 connected to the reference signal generator 15 for the upper reference value signal, and an output 42 for a seventh comparison signal. As can be seen in FIG. 6, in the case of an error-free Hall sensor 1 the voltage at the second connection point 3B in phase 1 must be less than the upper reference value T2. This is checked using the seventh comparison device 39. If the comparison result does not agree with this, in other words yields the logical value "1" (FIG. 7), the error signal is generated.

Finally, the Hall sensor 1 has an eighth comparison device 43, which has a fifteenth input 44 connected to the second connection point 3A, a sixteenth input 45 connected to the reference signal generator 20 for the lower reference value signal T1, and an output 46 for an eighth comparison signal. As can be seen in FIG. 6, in the case of an error-free Hall sensor 1 the voltage at the second connection point 3B in phase 1 must be less than the lower reference value T1. This is checked using the eighth comparison device 43. If the comparison result does not agree with this, in other words yields the logical value "1" (FIG. 7), the error signal is generated.

In the second, third, and fourth phase, the voltages at the connection points 3A, 3B, 3C, 3D are compared in accordance with the entries in lines 2, 3, and 4 of the table from FIG. 6. If a deviation from the reference value is determined in the case of at least one check, the error signal is generated by the evaluation device 47 and output at an error signal output 48. The (reference) comparison results listed in FIG. 6 can be stored in the evaluation device 47 or the data memory 9 in the form of a table. The individual comparison results are therefore linked with one another in the evaluation device 47.

The invention claimed is:

1. A method for operation of a Hall sensor, wherein the Hall sensor has a Hall sensor element that has multiple connection points spaced apart from one another, having a current supply source or voltage supply source that has a first and a second supply connector for output of a supply current or a supply voltage, wherein the first supply connector is connected or can be connected to a first connection point of the Hall sensor element, and the second supply connector is connected or can be connected to a second connection point of the Hall sensor element, so as to feed a current into the Hall sensor element, and characterized in that the Hall sensor has a first comparison device, which has a first input connected to a third connection point, a second input connected to a reference signal generator for an upper reference value signal, and an output for a first comparison signal, that the Hall sensor has a second comparison device, which has a third input connected to the third connection point, a fourth input connected to a reference signal generator for a lower reference value signal, and an output for a second comparison signal, and that the outputs of the first and second comparison devices are connected to an evaluation device for generating an error signal that is a function of the first and second comparison signal, and wherein the Hall sensor has a fifth comparison device, which has a ninth input connected to the first connection point, a tenth input connected to the reference signal generator for the upper reference value signal, and an output for a fifth comparison signal, that the Hall sensor has a sixth comparison device, which has an eleventh input connected to the first connection point, a twelfth input connected to the reference signal generator for the lower reference value signal, and an output for a sixth comparison signal, and that the evaluation device is configured in such a manner that the error signal is also a function of the fifth and sixth comparison signal, method having the following steps:
a) providing a Hall sensor, which has a Hall sensor element having multiple connection points spaced apart from one another, and providing a current supply source or voltage supply source, which has supply connectors for output of a supply current or a supply voltage,
b) connecting a first connection point of the Hall sensor element to a first supply connector and connecting a second connection point of the Hall sensor element to a second supply connector, so as to apply the supply voltage to the Hall sensor element or to conduct the supply current through the Hall sensor element, characterized by the following further steps:
c) providing a lower reference value and an upper reference value for a voltage applied at a third connection point of the Hall sensor element,
d) detecting a first voltage value for this voltage,
e) comparing the first voltage value with the lower reference value and the upper reference value, and
f) generating an error signal as a function of the results of these comparisons.

2. The method according to claim 1, comprising the following further steps:
a) detecting a second voltage value for a voltage applied at a fourth connection point of the Hall sensor element,
b) comparing the second voltage value with the lower reference value and the upper reference value,
c) generating the error signal as a function of the results of these comparisons.

3. The method according to claim 1, comprising the following further steps:
a) detecting a third voltage value for a voltage applied at the first connection point of the Hall sensor element,
b) comparing the third voltage value with the lower reference value and the upper reference value,
c) generating the error signal as a function of the results of these comparisons.

4. The method according to claim 1, comprising the following further steps:
a) detecting a fourth voltage value for a voltage applied at the second connection point of the Hall sensor element,
b) comparing the fourth voltage value with the lower reference value and the upper reference value,
c) generating the error signal as a function of the results of these comparisons.

5. The method according to claim 1, characterized in that the method steps b), d), e), and f) stated in claim 1 are run through multiple times, wherein during the second and, if applicable, every further pass, the connection points of the Hall sensor element are cyclically exchanged in each instance.

6. A Hall sensor having a Hall sensor element that has multiple connection points spaced apart from one another, having a current supply source or voltage supply source that has a first and a second supply connector for output of a supply current or a supply voltage, wherein the first supply connector is connected or can be connected to a first connection point of the Hall sensor element, and the second supply connector is connected or can be connected to a second connection point of the Hall sensor element, so as to feed a current into the Hall sensor element, characterized in that the Hall sensor has a first comparison device, which has a first input connected to a third connection point, a second input connected to a reference signal generator for an upper reference value signal, and an output for a first comparison signal, that the Hall sensor has a second comparison device, which has a third input connected to the third connection point, a fourth input connected to a reference signal generator for a lower reference value signal, and an output for a second comparison signal, and that the outputs of the first and second comparison devices are connected to an evaluation device for generating an error signal that is a function of the first and second comparison signal, and characterized in that the Hall sensor has a seventh comparison device, which has a thirteenth input connected to the second connection point, a fourteenth input connected to the reference signal generator for the upper reference value signal, and an output for a seventh comparison signal, that the Hall sensor has an eighth comparison device, which has a fifteenth input connected to the second connection point, a sixteenth input connected to the reference signal generator for the lower reference value signal, and an output for an eighth comparison signal, and that the evaluation device is configured in such a manner that the error signal is also a function of the seventh and eighth comparison signal.

7. The Hall sensor according to claim 6, characterized in that the Hall sensor has a third comparison device, which has a fifth input connected to a fourth connection point, a sixth input connected to the reference signal generator for the upper reference value signal, and an output for a third comparison signal, that the Hall sensor has a fourth comparison device, which has a seventh input connected to the fourth connection point, an eighth input connected to the reference signal generator for the lower reference value signal, and an output for a fourth comparison signal, and that the outputs of the third and fourth comparison devices are connected to the evaluation device, and the evaluation device is configured in such a manner that the error signal is also a function of the third and fourth comparison signal.

8. The Hall sensor according to claim 7, characterized in that the Hall Sensor has a switching device connected to the supply source, in control connection with a control device, which is configured in such a manner
a) that in a first operating state
the first and third inputs are connected to the third connection point,
the fifth and seventh inputs are connected to the fourth connection point,
a ninth and an eleventh inputs are connected to the first connection point,
the thirteenth and fifteenth inputs are connected to the second connection point, b) that in a second operating state
the first and third inputs are connected to the fourth connection point,
the fifth and seventh inputs are connected to the first connection point,
the ninth and eleventh inputs are connected to the second connection point,
the thirteenth and fifteenth inputs are connected to the third connection point,
c) that in a third operating state
the first and third inputs are connected to the first connection point,
the fifth and seventh inputs are connected to the second connection point,
the ninth and eleventh inputs are connected to the third connection point,
the thirteenth and fifteenth inputs are connected to the fourth connection point, d) that in a fourth operating state
the first and third inputs are connected to the second connection point,
the fifth and seventh inputs are connected to the third connection point,
the ninth and eleventh inputs are connected to the fourth connection point,
the thirteenth and fifteenth inputs are connected to a fifth connection point,
and that the second, sixth, a tenth, and fourteenth inputs are connected, in each instance, to the reference value generator for the upper reference value signal, and the fourth, eighth, a twelfth, and sixteenth inputs are connected, in each instance, to the reference value generator for the lower reference value signal.

* * * * *

UNITED STATES PATENT AND TRADEMARK OFFICE
CERTIFICATE OF CORRECTION

PATENT NO. : 11,397,223 B2  
APPLICATION NO. : 16/511181  
DATED : July 26, 2022  
INVENTOR(S) : Baumann et al.

It is certified that error appears in the above-identified patent and that said Letters Patent is hereby corrected as shown below:

In the Claims

Column 11, Line 22, Claim 1, delete "method" and insert -- the method --

Signed and Sealed this
Twenty-seventh Day of September, 2022

Katherine Kelly Vidal  
*Director of the United States Patent and Trademark Office*